(12) United States Patent
Lu et al.

(10) Patent No.: US 9,653,581 B2
(45) Date of Patent: May 16, 2017

(54) SEMICONDUCTOR DEVICE AND METHOD OF MAKING

(71) Applicant: Taiwan Semiconductor Manufacturing Company Limited, Hsin-Chu (TW)

(72) Inventors: Wen-Tai Lu, Hsinchu (TW); Chun-Feng Nieh, Hsinchu (TW); Hou-Yu Chen, Zhubei (TW); Yu-Chang Lin, Hsinchu (TW)

(73) Assignee: TAIWAN SEMICONDUCTOR MANUFACTURING COMPANY LIMITED, Hsin-Chu (TW)

( * ) Notice: Subject to any disclaimer, the term of this patent is extended or adjusted under 35 U.S.C. 154(b) by 0 days.

(21) Appl. No.: 15/006,263

(22) Filed: Jan. 26, 2016

(65) Prior Publication Data

US 2016/0141394 A1     May 19, 2016

Related U.S. Application Data

(62) Division of application No. 14/091,741, filed on Nov. 27, 2013, now Pat. No. 9,252,271.

(51) Int. Cl.
*H01L 29/78* (2006.01)
*H01L 29/66* (2006.01)

(52) U.S. Cl.
CPC .. *H01L 29/66795* (2013.01); *H01L 29/66545* (2013.01); *H01L 29/66636* (2013.01); *H01L 29/785* (2013.01); *H01L 29/7843* (2013.01); *H01L 29/7847* (2013.01); *H01L 29/66553* (2013.01); *H01L 29/66871* (2013.01); *H01L 2924/13067* (2013.01)

(58) Field of Classification Search
CPC ......... H01L 29/66795; H01L 29/66545; H01L 29/7847; H01L 29/66636; H01L 29/66871; H01L 29/66553; H01L 29/735; H01L 2924/13067; H01L 28/7843; H01L 29/7851; H01L 29/41791
See application file for complete search history.

(56) References Cited

U.S. PATENT DOCUMENTS

2007/0105297 A1* 5/2007 Jeong ................ H01L 21/76801
438/197
2007/0249130 A1* 10/2007 Anderson ......... H01L 21/26586
438/301

(Continued)

OTHER PUBLICATIONS

Flachowsky. Stress Memorization Technique for n-MOSFETs: Where is the Stress Memorized? ULIS 2010—Ultimate Integration on Silicon. University of Glasgow, Mar. 18-19, 2010, pp. 149-152.*

*Primary Examiner* — Galina Yushina
(74) *Attorney, Agent, or Firm* — Cooper Legal Group, LLC

(57) ABSTRACT

A semiconductor device is provided. The semiconductor device includes a channel region disposed between a source region and a drain region, a gate structure over the channel region, an interlayer dielectric (ILD) layer proximate the gate structure, an ILD stress layer proximate the top portion of gate structure and over the ILD layer. The gate structure includes a first sidewall, a second sidewall and a top portion. A first stress memorization region is also provided. The first stress memorization region is proximate the top portion of the gate structure. A method of making a semiconductor device is also provided.

20 Claims, 17 Drawing Sheets

(56) References Cited

U.S. PATENT DOCUMENTS

| | | |
|---|---|---|
| 2011/0278676 A1 | 11/2011 | Cheng |
| 2013/0157431 A1 | 6/2013 | Tsai et al. |
| 2013/0187235 A1 | 7/2013 | Huang et al. |
| 2013/0200455 A1* | 8/2013 | Lo ..................... H01L 29/66795 257/347 |
| 2013/0200468 A1* | 8/2013 | Cai ................... H01L 29/66545 257/401 |
| 2013/0237026 A1* | 9/2013 | Lee ..................... H01L 29/7847 438/283 |

* cited by examiner

SEMICONDUCTOR DEVICE AND METHOD OF MAKING

RELATED APPLICATIONS

This application is a divisional of and claims priority to U.S. patent application Ser. No. 14/091,741, titled "SEMICONDUCTOR DEVICE AND METHOD OF MAKING" and filed on Nov. 27, 2013, which is incorporated herein by reference.

BACKGROUND

A transistor, such as MUGFET (multiple gate field effect transistor), comprises a source region, a drain region, a gate and a channel region between the source region and the drain region. As the name implies, MUGFETS often include more than one gate. In some MUGFETs multiple gates are controlled by a single gate electrode, wherein multiple gate surfaces act electrically as a single gate to control current flow through the channel region.

DETAILED DESCRIPTION

Figure 1:
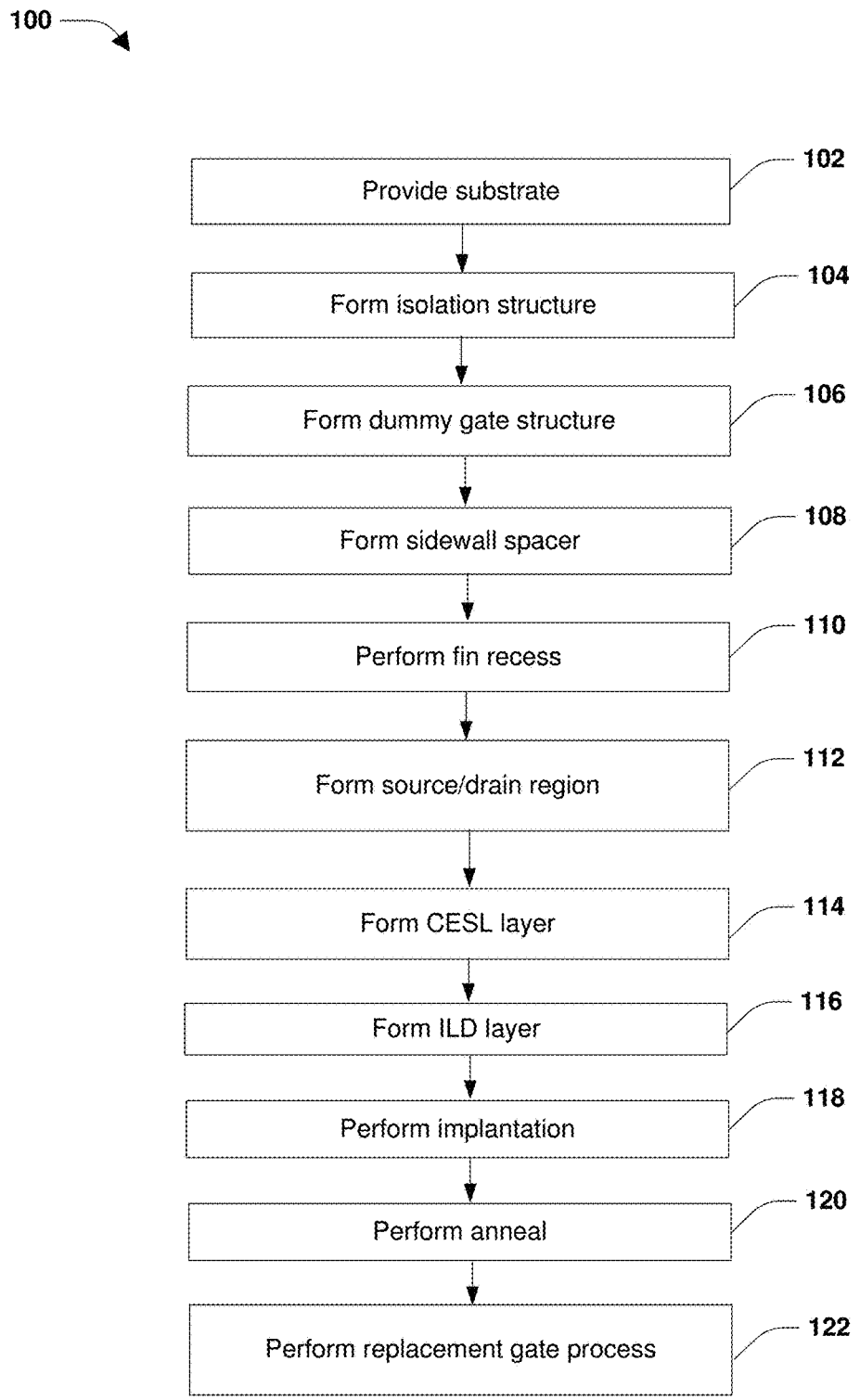
FIG. 1 is a flow diagram illustrating a method for fabricating a semiconductor device, according to some embodiments.

The claimed subject matter is now described with reference to the drawings, wherein like reference numerals are generally used to refer to like elements throughout. In the following description, for purposes of explanation, numerous specific details are set forth in order to provide an understanding of the claimed subject matter. It is evident, however, that the claimed subject matter can be practiced without these specific details. In other instances, structures and devices are illustrated in block diagram form in order to facilitate describing the claimed subject matter.

One or more semiconductor devices and one or more methods for forming such semiconductor devices are provided herein. In some embodiments, a semiconductor device includes a MUGFET device, such as a multi-gate transistors or fin-type multi-gate transistor. In some embodiments, a semiconductor device includes at least one of a PFET or a NFET.

Referring to FIG. 1, illustrated is a flow diagram of a method 100 for fabricating a semiconductor device 200 according to some embodiments. Referring also to FIGS. 2 to 15b, illustrated are various views of the semiconductor device 200 at various stages of fabrication according to some embodiments, such as according to the method 100 of FIG. 1. In some embodiments, part of the semiconductor device 200 is fabricated with a CMOS process flow. In some embodiments, additional processes are provided at least one of before, during, or after the method 100 of FIG. 1.

Figure 2:
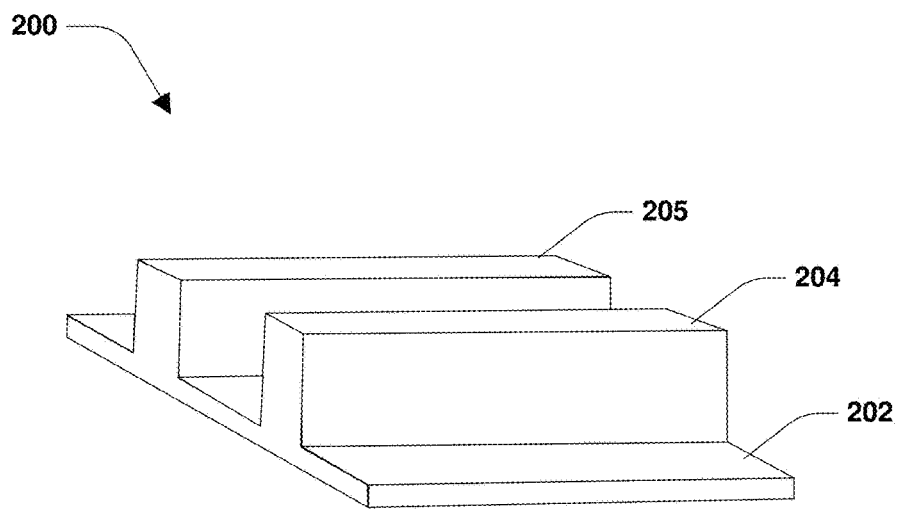
FIG. 2 is a perspective view of a semiconductor device during fabrication, according to some embodiments.

At 102, a substrate 202 is provided, as illustrated in FIG. 2. In some embodiments, the substrate 202 is a bulk silicon substrate. According to some embodiments, the substrate 202 includes a wafer or a die formed from a wafer. In some embodiments, the substrate 202 includes at least one of silicon, germanium, silicon germanium, silicon carbide, gallium arsenic, gallium phosphide, indium phosphide, indium arsenide or indium antimonide. In some embodiments, the substrate 202 is a silicon-on-insulator (SOI) substrate. In some embodiments, the SOI substrate is fabricated using at least one of separation by implantation of oxygen (SIMOX) or wafer bonding.

In some embodiments, the substrate 202 includes an insulator layer. In some embodiments, the insulator layer includes silicon oxide or sapphire. In some embodiments, the insulator layer is a buried oxide layer (BOX). In some embodiments, the insulator layer is formed by at least one of an implantation (e.g., SIMOX), oxidation, deposition or other suitable process. In some embodiments, the insulator layer is a component of an SOI substrate.

In some embodiments, the substrate 202 includes various doped regions. In some embodiments, the doped regions include at least one of p-type wells or n-type wells. In some embodiments, the doped regions are doped with at least one of p-type dopants, such as boron or $BF_2$ or n-type dopants, such as phosphorus or arsenic. In some embodiments, the doped regions are formed on the substrate 202 in at least one of a P-well structure, an N-well structure, a dual-well structure or a raised structure. In some embodiments, the semiconductor substrate 202 includes at least one of a first active region or a second active region. In some embodiments, at least one of the first active region or second active regions is configured as at least one of an N-type field-effect transistor (nFET) or a P-type field-effect transistor (pFET). In some embodiments, at least one of the nFET or pFET is a metal-oxide-semiconductor field-effect transistor (MOSFET)

In some embodiments, a first fin structure 204 and a second fin structure 205 are formed at least one of on or from the substrate 202. In some embodiments, at least one of the first fin structure 204 or the second fin structure 205 is formed by at least one of a deposition, photolithography, or etching processes. In some embodiments, the photolithography process includes forming a pattern in a resist that is formed over the substrate. In some embodiments, etching is then performed to remove areas of the substrate not covered by the patterned resist to form the fin structures. In some embodiments, the etching process includes a reactive ion etching (RIE) process.

Figure 3:
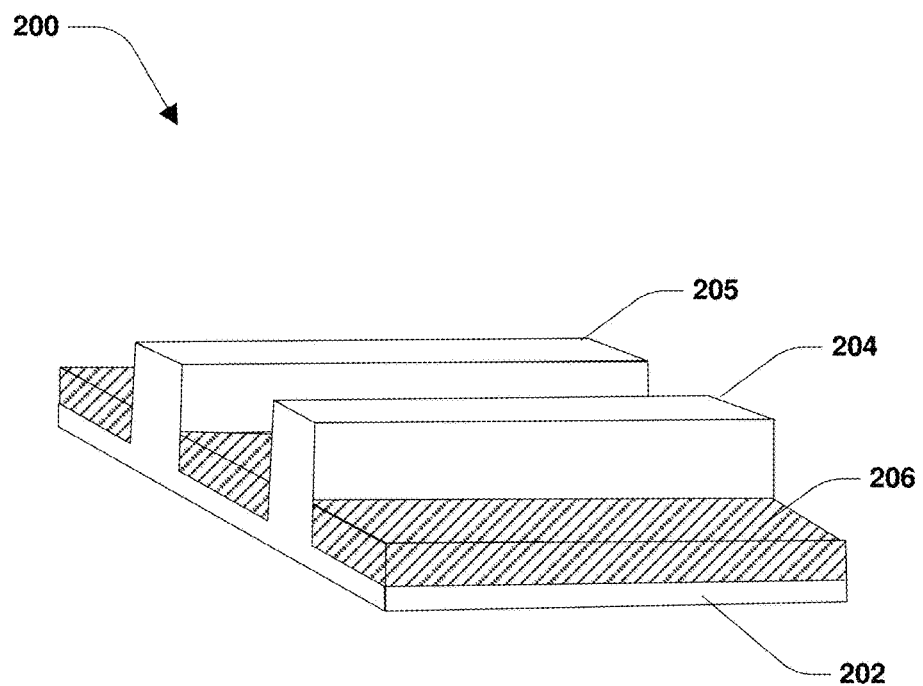
FIG. 3 is a perspective view of a semiconductor device during fabrication, according to some embodiments.

At 104, an isolation structure 206 is formed, as illustrated in FIG. 3. In some embodiments, the isolation structure 206 is formed on the substrate 202. In some embodiments, the isolation structure 206 is formed between at least one of the first fin structure 204 or the second fin structure 205. In some embodiments, the isolation structure 206 is a shallow trench isolation (STI) structure. In some embodiments, the isolation structure 206 is formed by a deposition process. In some embodiments, the isolation structure 206 includes at least one of silicon oxide, silicon nitride, silicon oxynitride or an air gap.

Figure 4:
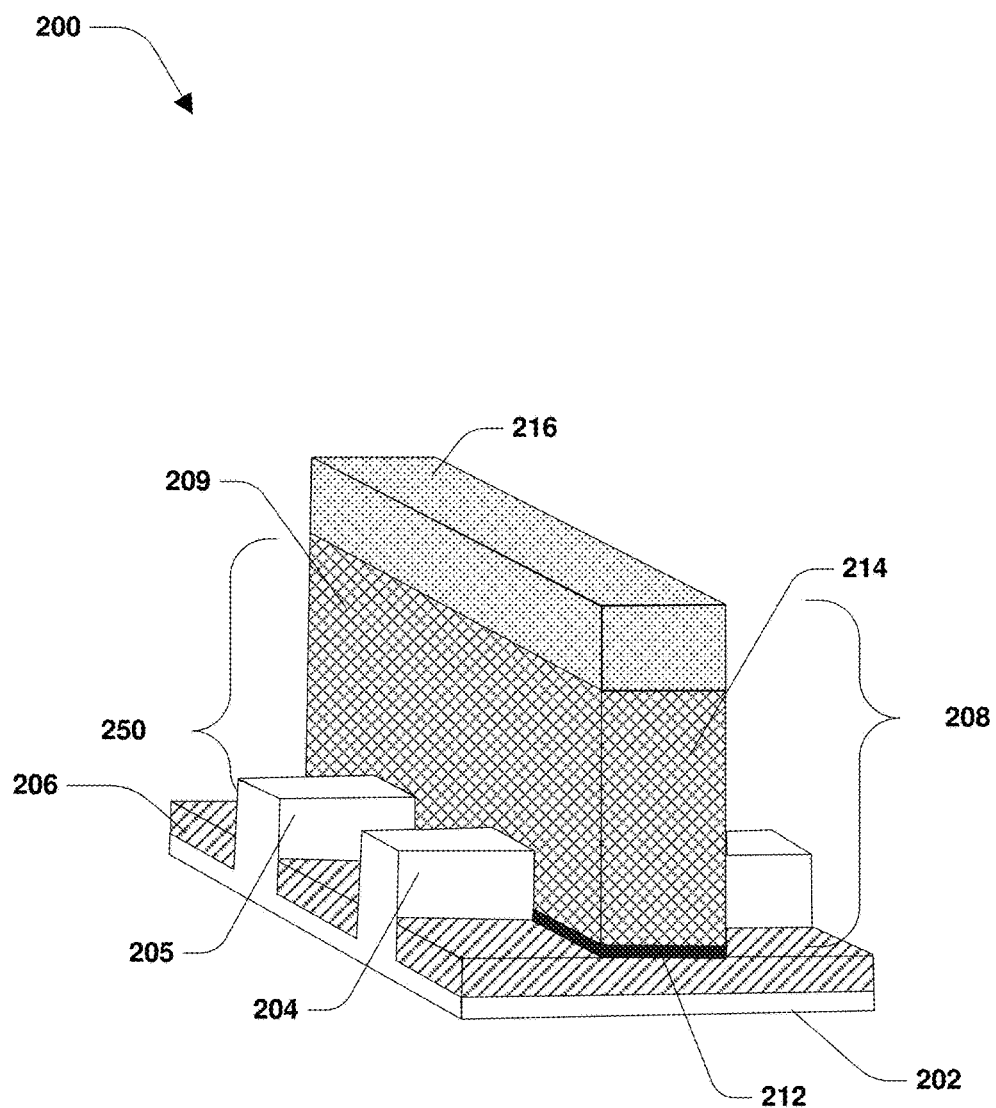
FIG. 4 is a perspective view of a semiconductor device during fabrication, according to some embodiments.

At 106, a dummy gate structure 208 is formed, as illustrated in FIG. 4. In some embodiments, the dummy gate structure 208 is formed over at least one of the first fin structure 204, the second fin structure 205, the isolation structure 206 or the substrate 202. In some embodiments, the dummy gate structure 208 includes at least one of a dummy dielectric layer 212, a first dummy poly layer 214 or a hard mask layer 216. In some embodiments, the dummy gate structure includes at least one of a first sidewall not shown or a second sidewall 209. In some embodiments, at least one of the first sidewall or the second sidewall 209 are formed from a side surface of at least one of the dummy dielectric layer 212, the first dummy poly layer 214 or the hard mask layer 216.

In some embodiments, the dummy dielectric layer 212 is formed by a deposition process. In some embodiments, the dummy dielectric layer 212 includes an oxide. In some embodiments, the dummy dielectric layer 212 includes at least one of silicon oxide, silicon nitride, silicon oxynitride, $HfO_2$, HfSiO, HfSiON, HfTaO, HfTiO, HfZrO, zirconium oxide, aluminum oxide or hafnium dioxide-alumina ($HfO_2$, $Al_2O_3$) alloy. In some embodiments, the dummy dielectric layer 212 has a height about 0.5 to about 5 nanometers (nm).

In some embodiments, the first dummy poly layer 214 is formed over the dummy dielectric layer 212. In some embodiments, the first dummy poly layer 214 is formed by a deposition process. In some embodiments, the first dummy poly layer 214 includes a polysilicon. In some embodiments, the first dummy poly layer 214 has a height 250. In some embodiments, the height 250 is about 20 to about 100 nm.

In some embodiments, the hard mask layer 216 is formed over the first dummy poly layer 214. In some embodiments, the hard mask layer 216 is formed by a deposition process. In some embodiments, the hard mask layer 216 includes at least one of silicon nitride, silicon oxynitride or silicon carbide. In some embodiments, the hard mast layer 216 has a height ranging from about 1 to about 20 nanometers (nm).

In some embodiments, the dummy gate structure 208 is formed by any suitable process or processes. In some embodiments, the dummy gate structure 208 is formed by at least one of a deposition, photolithography patterning, or etching process. In some embodiments, the deposition process include at least one of a chemical vapor deposition (CVD), physical vapor deposition (PVD), atomic layer deposition (ALD), high density plasma CVD (HDPCVD), metal organic CVD (MOCVD), remote plasma CVD (RP-CVD), plasma enhanced CVD (PECVD) or plating process. In some embodiments, the photolithography patterning process include at least one of a photoresist coating, soft baking, mask aligning, exposure, post-exposure baking, developing the photoresist, rinsing or drying process. In some embodiments, the photolithography exposing process includes at least one of maskless photolithography, electron-beam writing, and ion-beam writing. In some embodiments, the etching processes include at least one of dry etching, wet etching or reactive ion etching.

Figure 5:
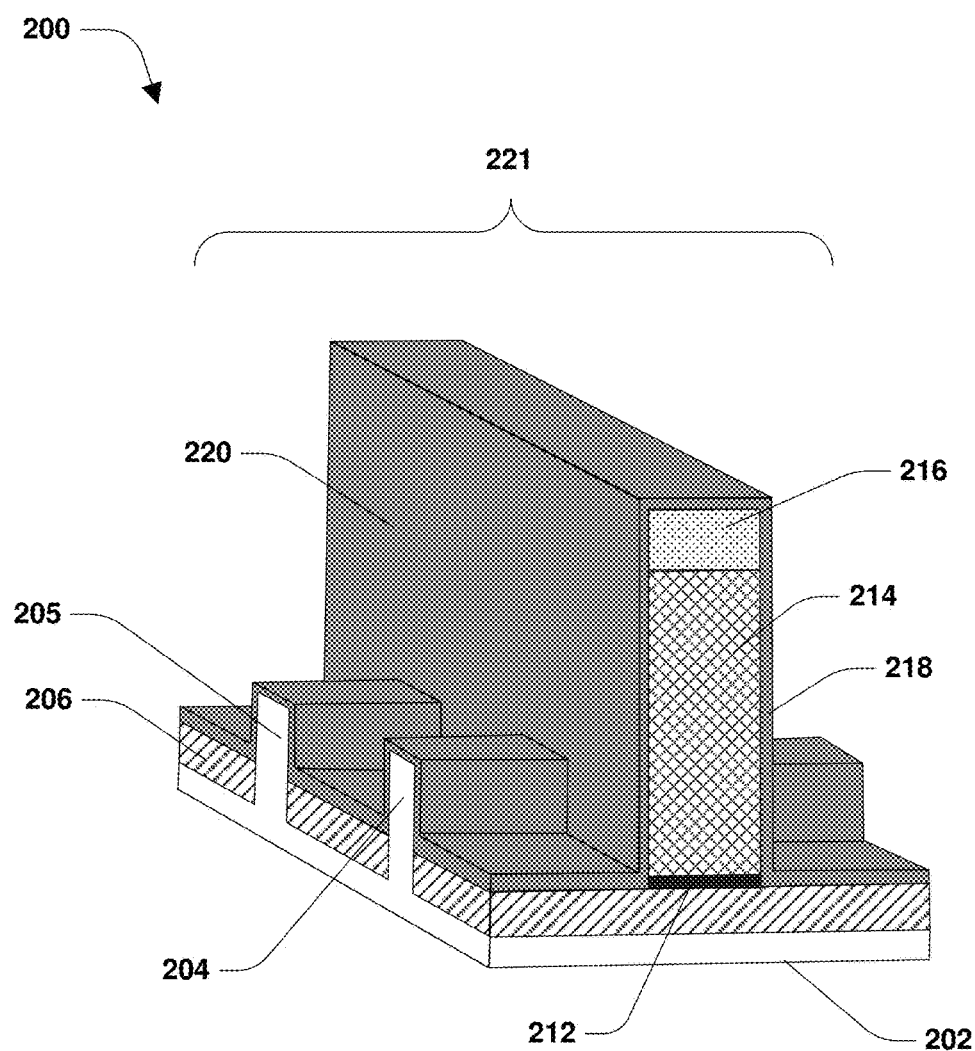
FIG. 5 is a perspective view of a semiconductor device during fabrication, according to some embodiments.

At, 108, a gate spacer material 221 is formed over exposed surfaces of existing portions of the semiconductor device 200, as illustrated in FIG. 5. In some embodiments, the gate spacer material 221 is deposited. in some embodiments, the gate spacer material 221 includes a dielectric material. In some embodiments, the dielectric material includes at least one of a silicon nitride, silicon carbide or silicon oxynitride.

Figure 6:
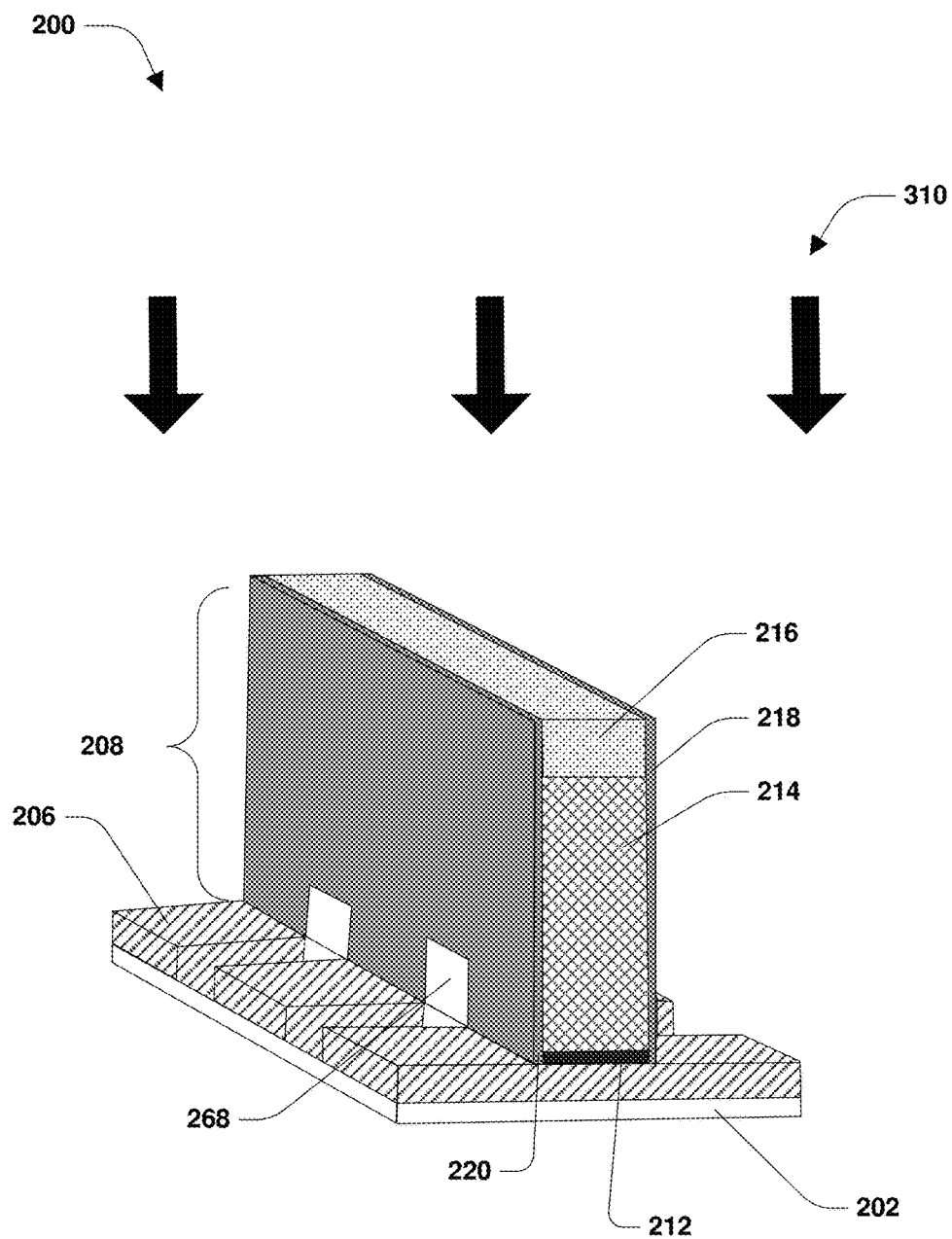
FIG. 6 is a perspective view of a semiconductor device during fabrication, according to some embodiments.

At 110, a fin recess 310 is performed, as illustrated in FIG. 6. In some embodiments, at least one of the first fin structure 204 or the second fin structure 205 is at least partially removed. In some embodiments, at least some of the gate spacer material 221 is at least partially removed leaving at least one of a first gate spacer 218 adjacent the first sidewall or a second gate spacer 220 adjacent the second sidewall 209. In some embodiments, at least a portion of one of the first fin structure 204 or the second fin structure 205 remains under the dummy gate structure 208 to form a channel region 268. In some embodiments, the fin recess 310 includes forming a photoresist layer over the semiconductor device 200, patterning the photoresist layer to have openings that expose an active region of at least one of the first fin structure 204 or the second fin structure 205 and etching back material to recess at least one of the first fin structure 204 or the second fin structure 205. In some embodiments, the etching includes at least one of dry etching, wet etching or reactive ion etching.

Figure 7:
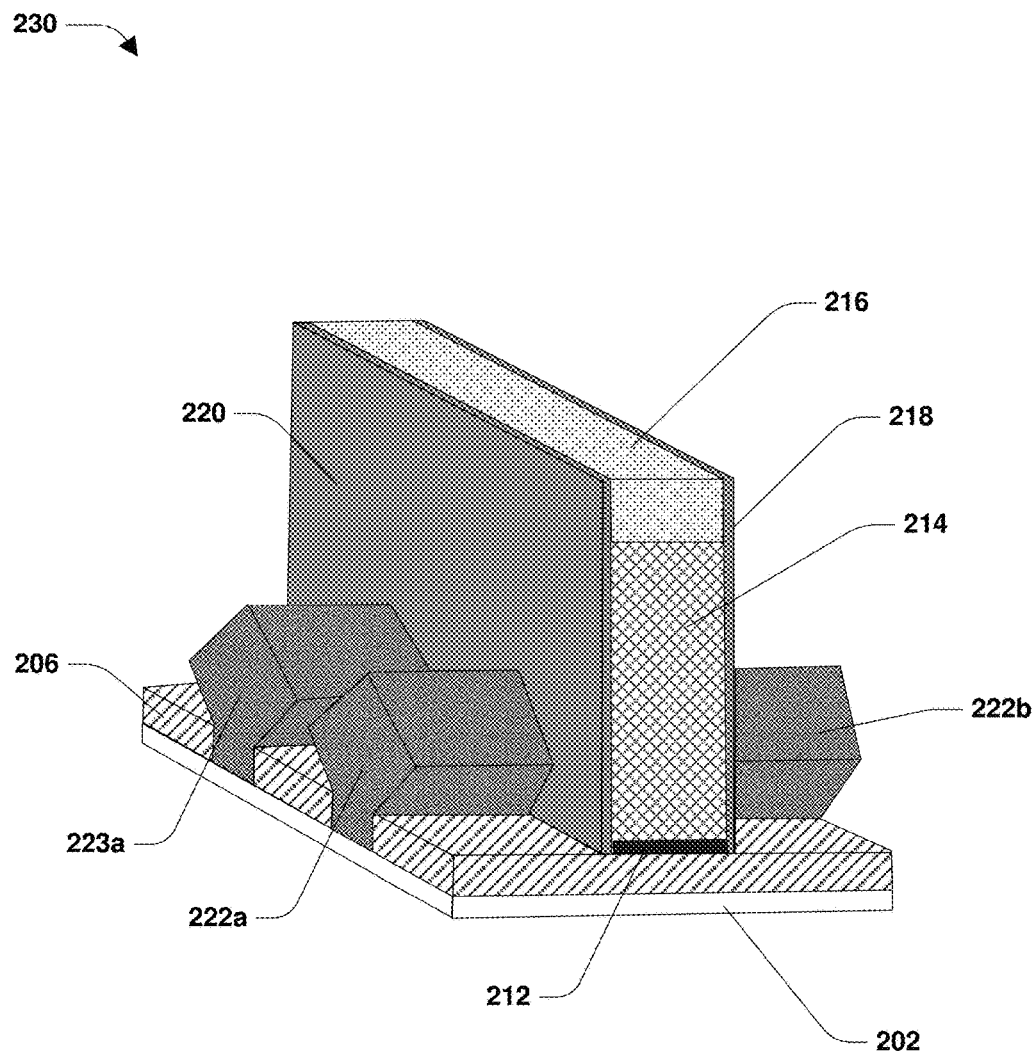
FIG. 7 is a perspective view of a semiconductor device during fabrication, according to some embodiments.

At 112, a source/drain (S/D) regions 222a, 222b, 223a, 223b (not shown) are formed, as illustrated in FIG. 7. In some embodiments, the regions 222a and 223a are source regions while regions 222b and 224b are drain regions. In some embodiments, the regions 222a and 223a are drain regions while regions 222b and 224b are source regions. In some embodiments, channel regions 268 are disposed between the source regions and the drain regions. In some embodiments, the S/D regions are formed by epitaxial (epi) growth. In some embodiments, the epi growth includes at least one of a vapor-phase epitaxy (VPE), ultra-high vacuum CVD (UHV-CVD) or molecular beam epitaxy. In some embodiments, at least some of the S/D regions are in-situ doped. In some embodiments, a dopant used for in-situ doping includes at least one of a p-type dopant or an n-type dopant. In some embodiments, the p-type dopant includes at least one of boron or $BF_2$. In some embodiments, the n-type dopant includes at least one of phosphorus or arsenic.

Figure 8:
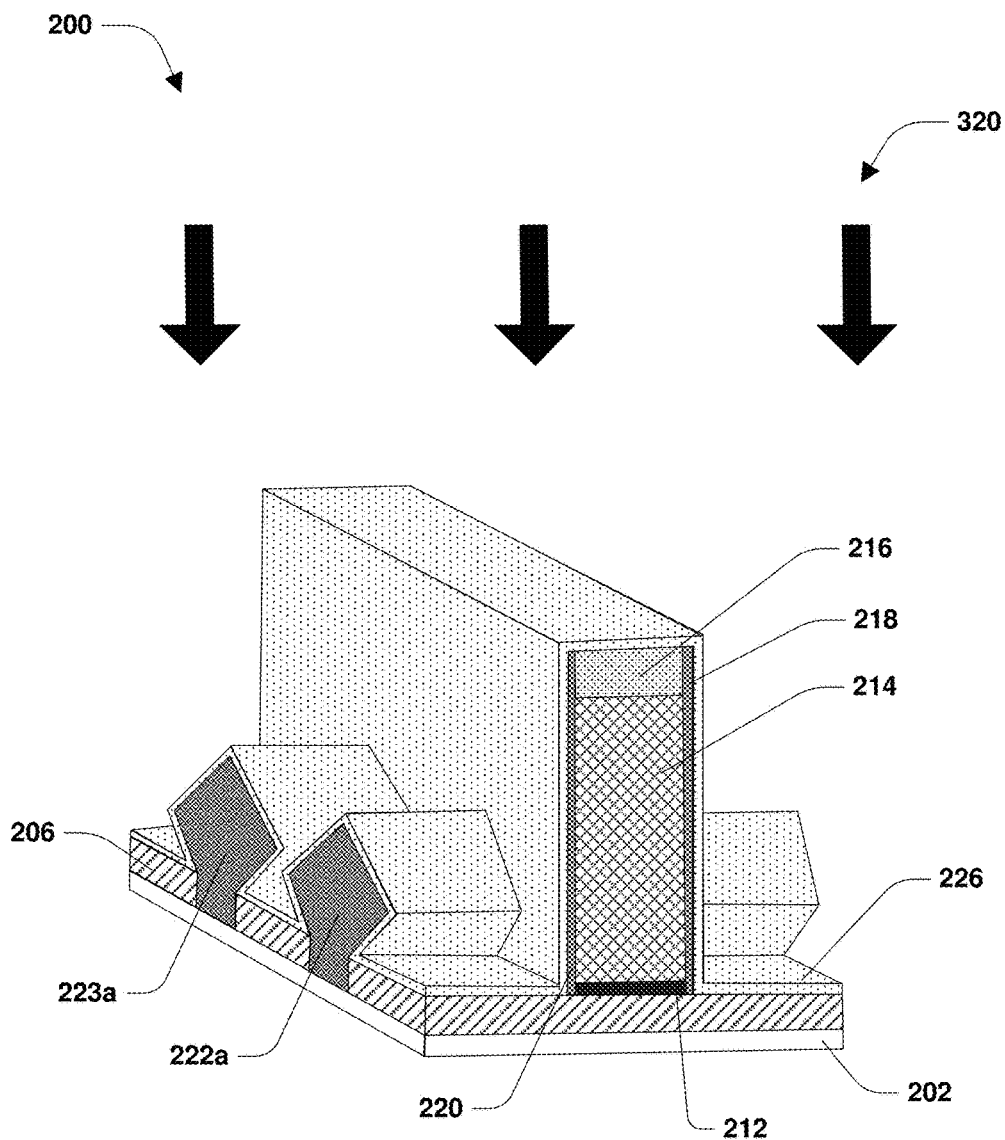
FIG. 8 is a perspective view of a semiconductor device during fabrication, according to some embodiments.

At 114, a CESL (contact etch stop layer) 226 is formed, as illustrated in FIG. 8. In some embodiments, the CESL 226 is formed by a process 320. In some embodiments, the process 320 includes at least one of PECVD, sub atmospheric chemical vapor deposition (SACVD), low pressure chemical vapor deposition (LPCVD), ALD, HDPCVD, plasma enhanced atomic layer deposition (PEALD), molecular layer deposition (MLD) or plasma impulse chemical vapor deposition (PICVD). In some embodiments, the CESL is formed over at least one of the S/D regions 222a, 222b, 223a, 223b, the dummy gate structure 208, the first gate spacer 218, the second gate spacer 220 or the isolation structure 206. In some embodiments, the CESL 226 includes a dielectric material. In some embodiments, the CESL 226 includes at least one of $SiN_x$, $SiO_x$, SiON, SiC, SiCN, BN, SiBN or SiCBN. In some embodiments, the CESL 226 is about 10 to about 100 nm thick.

Figure 9:
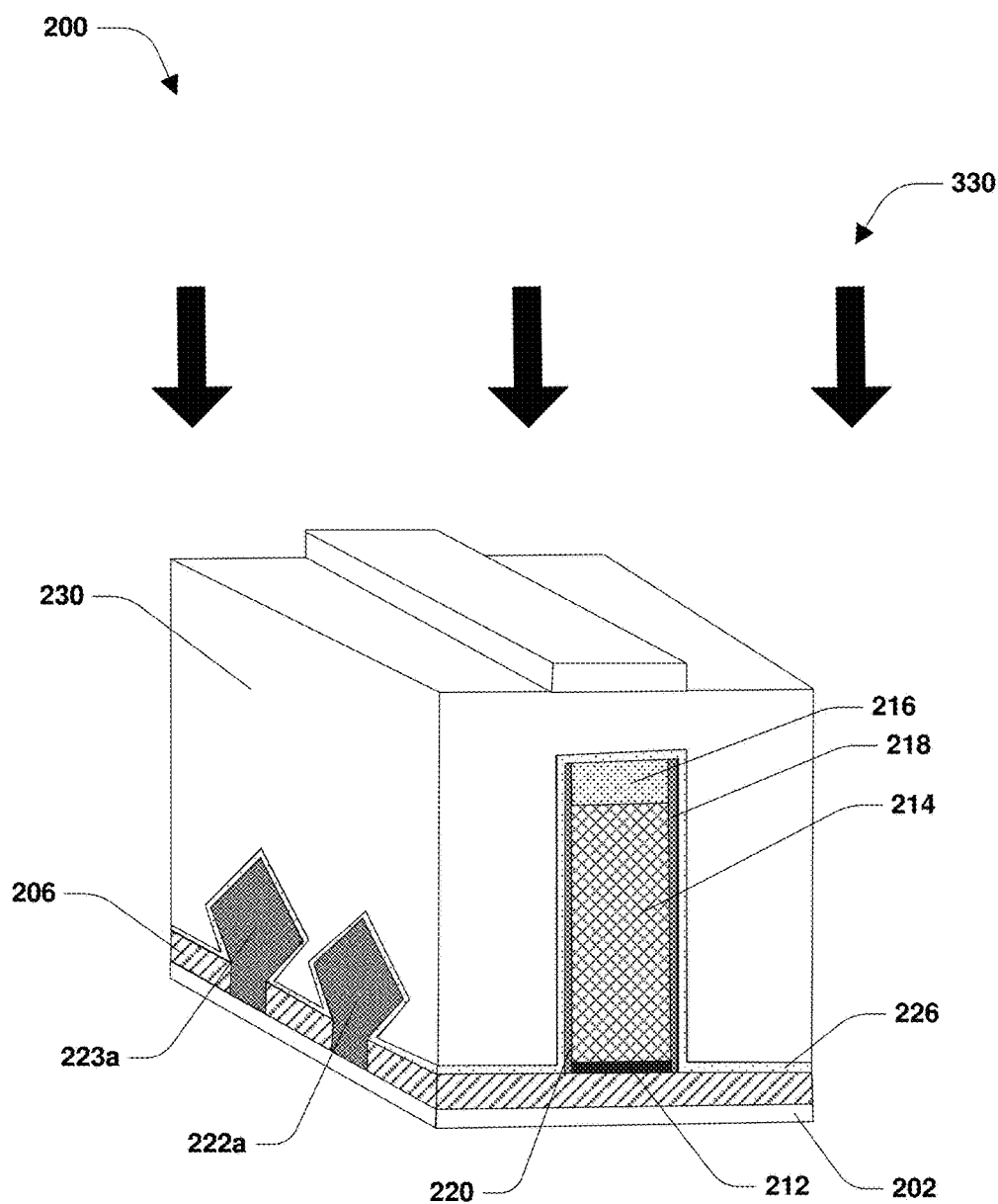
FIG. 9 is a perspective view of a semiconductor device during fabrication, according to some embodiments.
Figure 10:
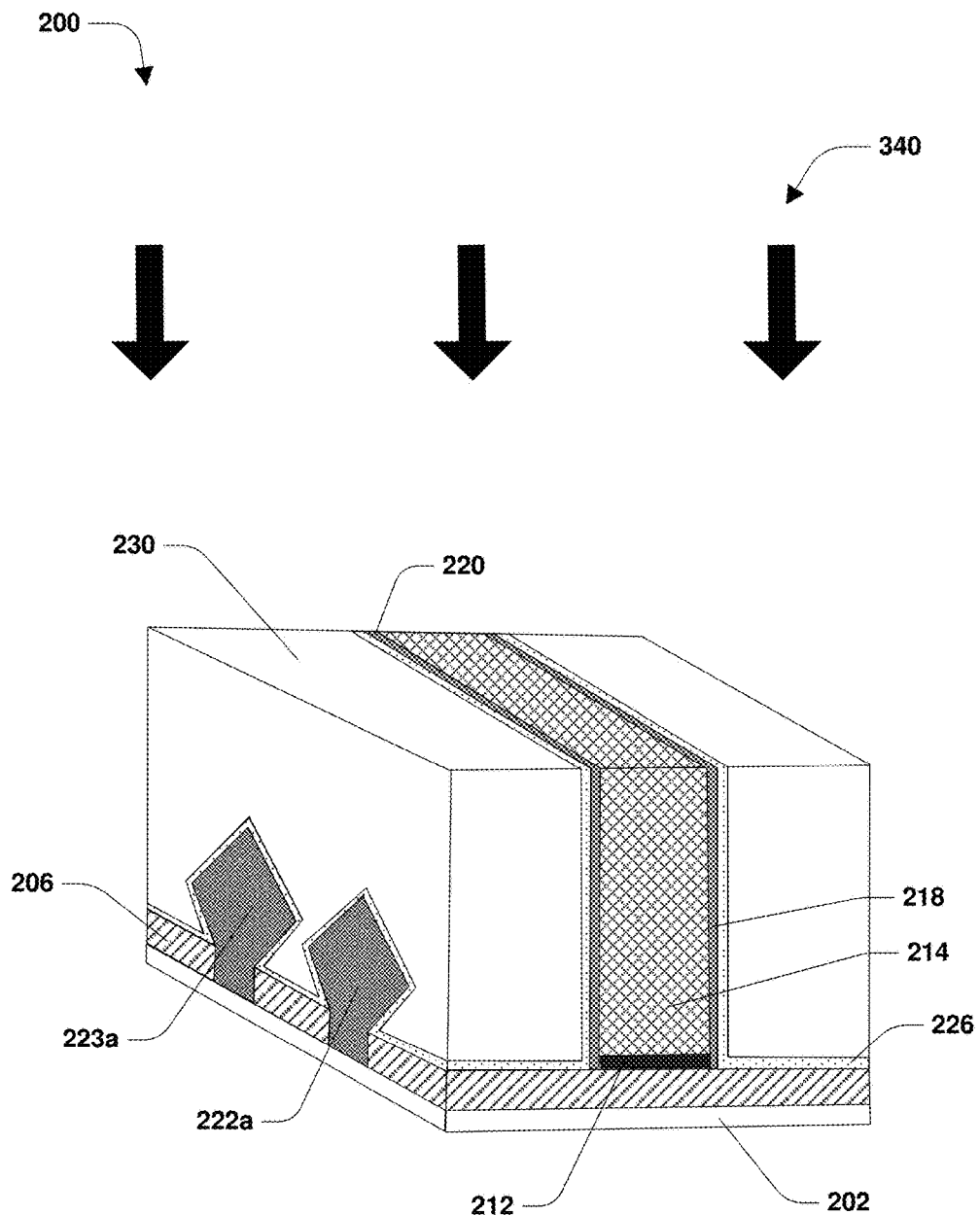
FIG. 10 is a perspective view of a semiconductor device during fabrication, according to some embodiments.

At 116, an ILD layer 230 is formed, as illustrated in FIG. 9. In some embodiments. the ILD layer 230 is formed by a process 330. In some embodiments, the process 330 includes a flowed chemical vapor deposition (FCVD). In some embodiments, the ILD layer 230 is formed over at least one of the substrate 202 or the CESL 226. In some embodiments, the ILD layer 230 includes an oxide. In some embodiments, the ILD layer 230 includes at least one of silicon oxide, silicon oxy-nitride, silicon carbide, or other suitable low-k materials. In some embodiments, the ILD layer 230 fills in a gap between an nFET device and an adjacent pFET device. In some embodiments, a process 340 is performed on the semiconductor device 200 to planarize the ILD layer 230, as illustrated in FIG. 10. In some embodiments, the process 340 includes a chemical mechanical polishing (CMP) process. In some embodiments, the process 340 exposes the dummy gate structure 208. In some embodiments, the process 340 removes the hard mask layer 216 and exposes an upper surface of the first dummy poly layer 214.

Figure 11A:
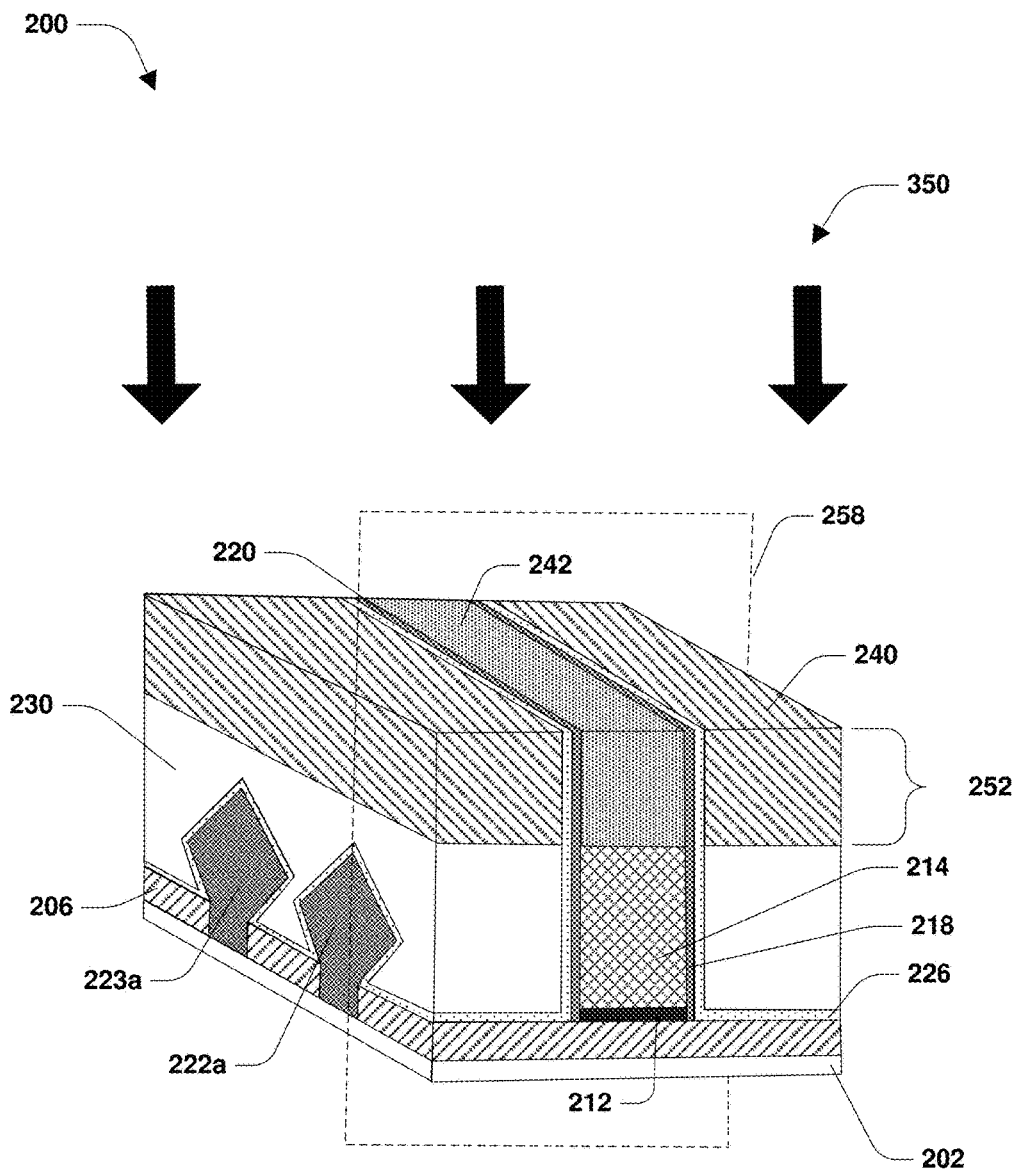
FIG. 11a is a perspective view of a semiconductor device during fabrication, according to some embodiments.
Figure 11B:
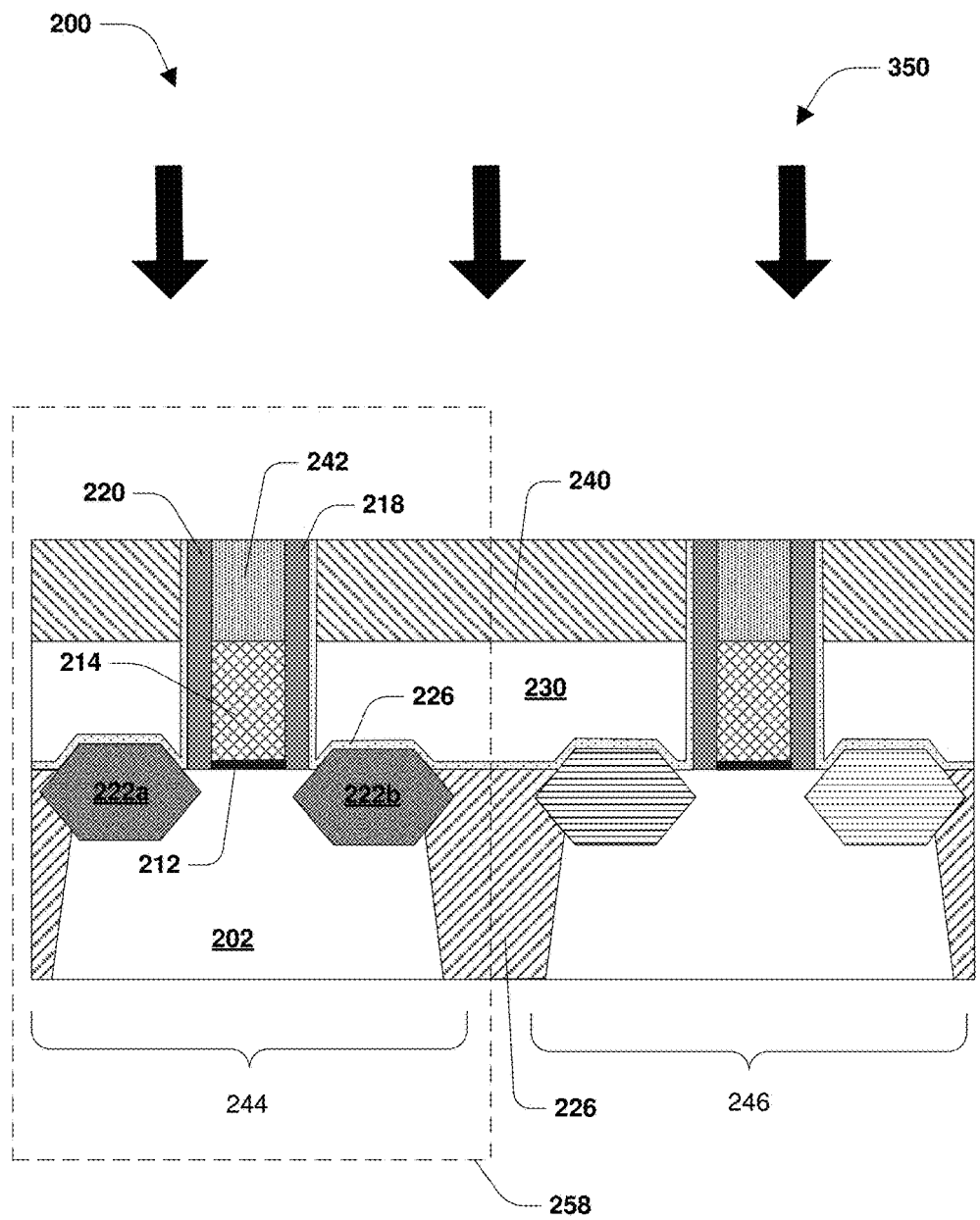
FIG. 11b is a cross-sectional view of a semiconductor device during fabrication, according to some embodiments.

At 118, an implantation 350 is performed, as illustrated in FIG. 11a and FIG. 11b. In some embodiments, the implantation 350 implants a dopant. In some embodiments, the dopant includes at least one of Si, Ge, Ar, F, N, Xe, $BF_2$ or As. In some embodiments, the dopant is implanted into at least one of the ILD layer 230 or the first dummy poly layer 214. In some embodiments, the implantation 350 forms at least one of an implanted ILD layer 240 or an implanted dummy poly layer 242. In some embodiments, the implanted dummy poly layer 242 is at least partially amorphous. In some embodiments, the implanted dummy poly layer 242 is over the first dummy poly layer 214. In some embodiments, the implanted ILD layer 240 is over the ILD layer 230. In some embodiments, at least one of the implanted ILD layer 240 or the implanted dummy poly layer 242 has a depth 252. In some embodiments, the depth 252 is about 5 to about 50 nm. In some embodiments, the depth 252 is controlled by at least one of an implant energy, implantation angel, implant dosage or the dopant implanted. In some embodiments, the implant dosage is about $1E^{14}$ to about $1E^{16}$ cm$^2$.

Figure 12A:
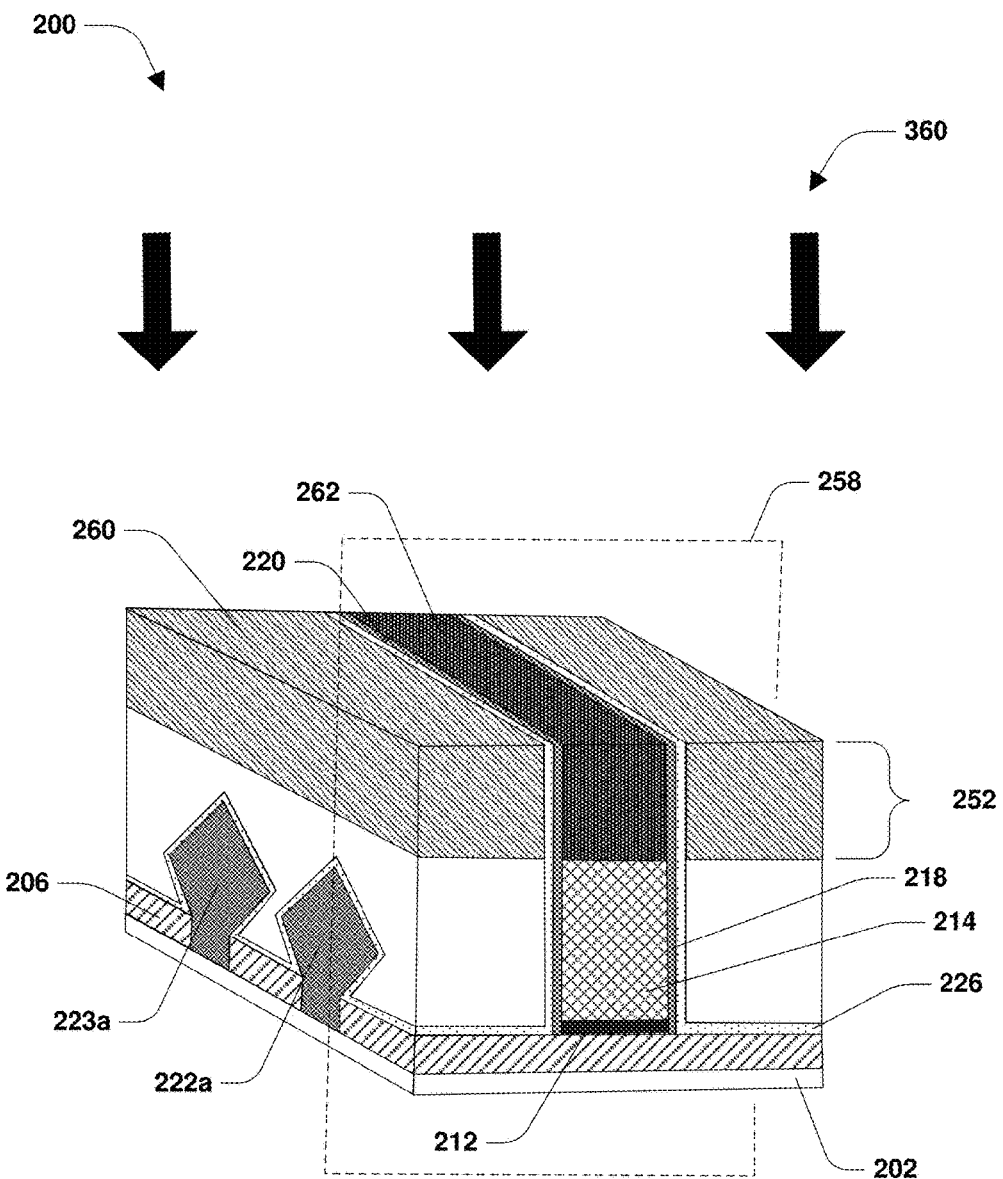
FIG. 12a is a perspective view of a semiconductor device during fabrication, according to some embodiments.
Figure 12B:
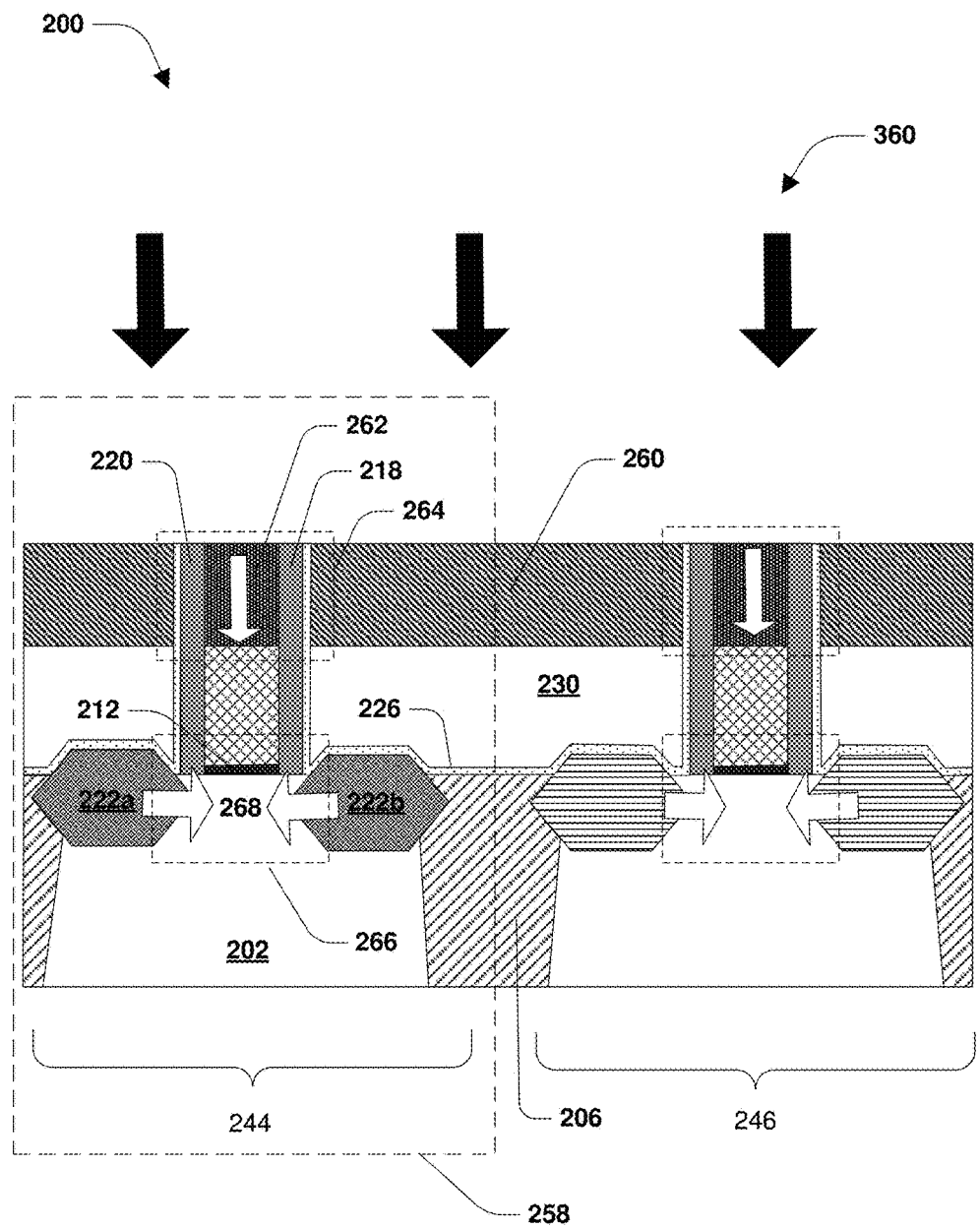
FIG. 12b is a cross-sectional view of a semiconductor device during fabrication, according to some embodiments.
Figure 15A:
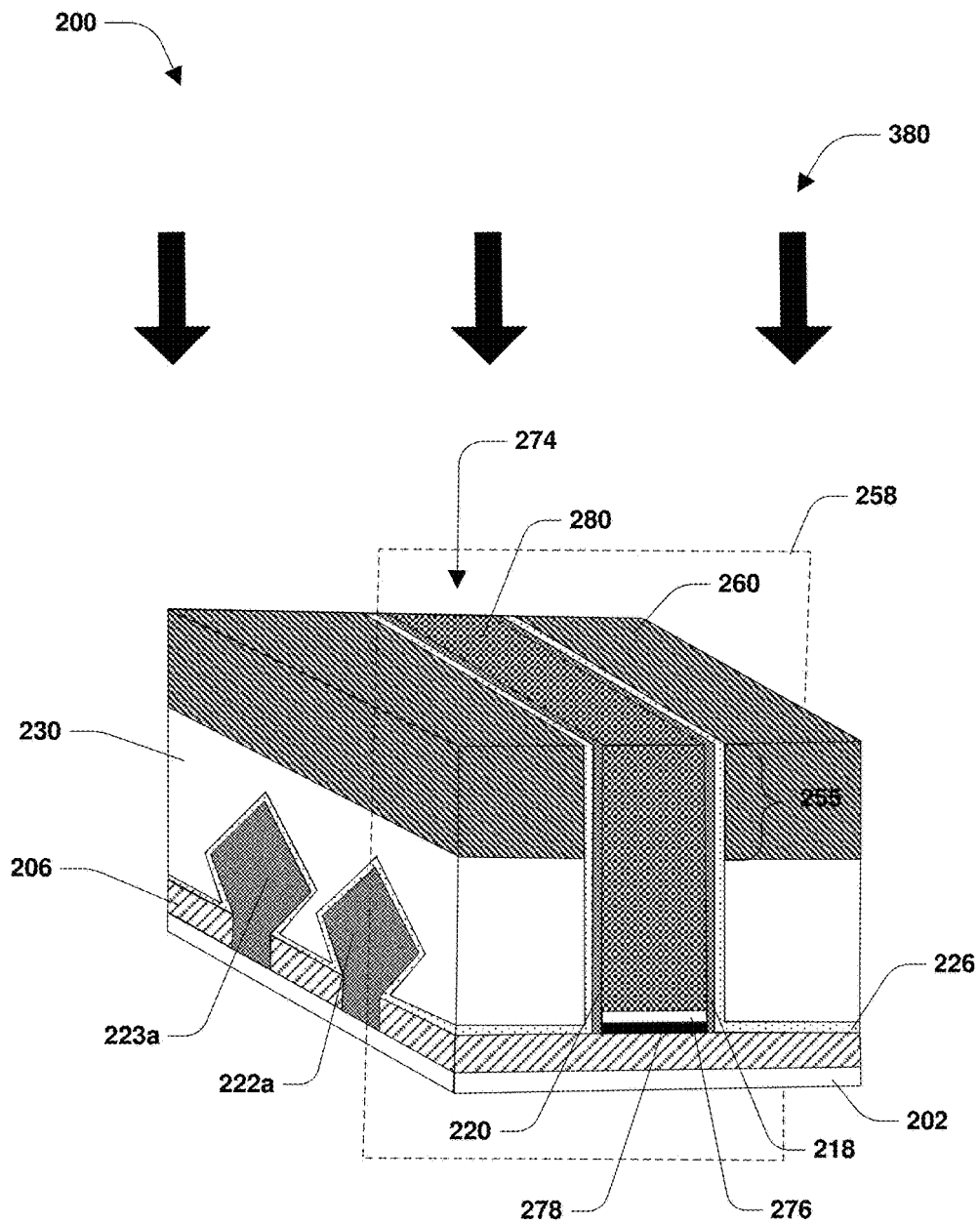
FIG. 15a is a cross-sectional view of a semiconductor device during fabrication, according to some embodiments.
Figure 15B:
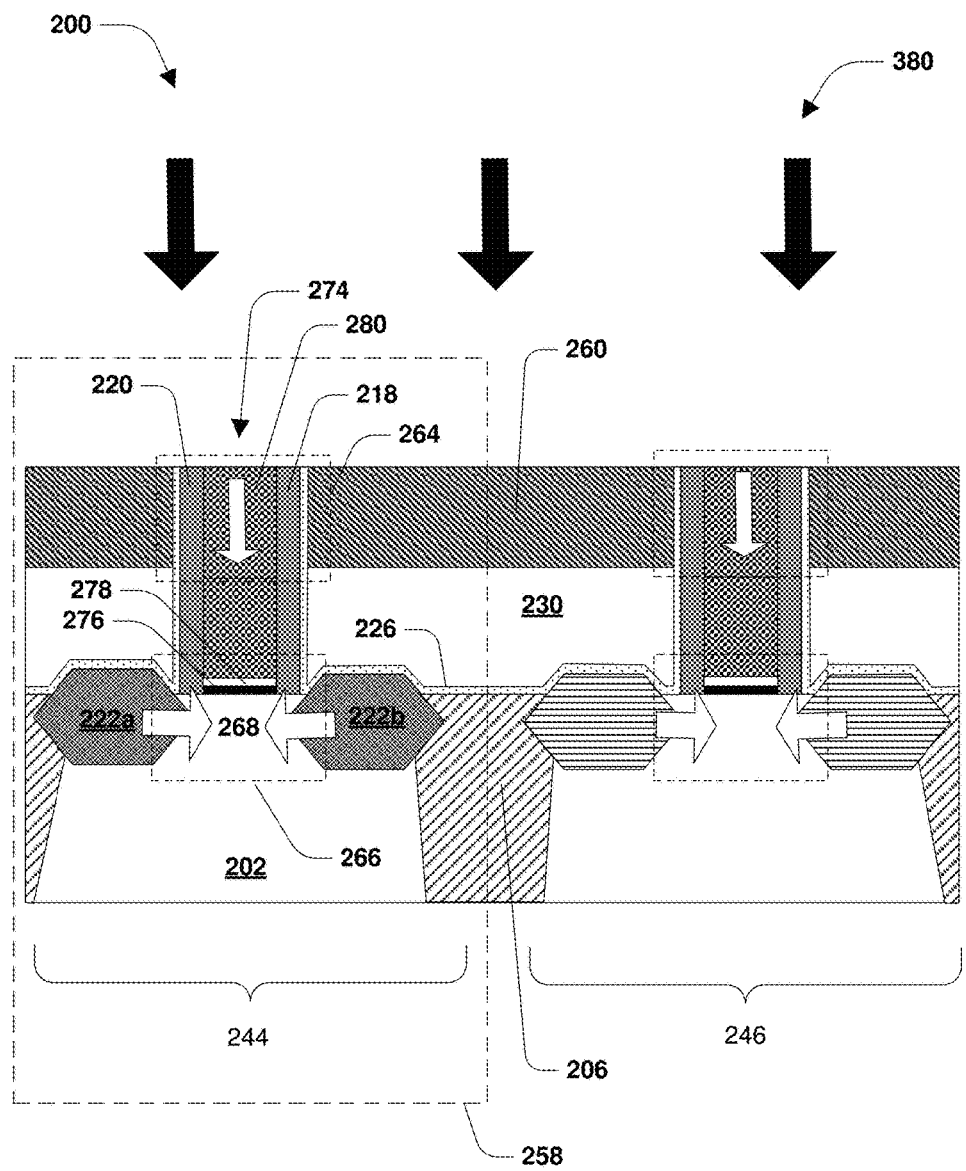
FIG. 15b is a cross-sectional view of a semiconductor device during fabrication, according to some embodiments.

FIGS. 11b, 12b and 15b provide various cross-sectional views of the semiconductor device 200 along plane 258. In some embodiments, the semiconductor device 200 includes an nFET device 244 and a pFET device 246. In some embodiments, the nFET device 244 and the pFET device 246 are substantially similar other than having S/D regions doped with different type dopants. In some embodiments, the method 100 is performed on the nFET device 244 and the pFET device 246 at the same time.

At 120, an anneal 360 is performed, as illustrated in FIG. 12a and FIG. 12b. In some embodiments, the anneal 360 includes at least one of a rapid thermal anneal (RTA), a dynamic spike anneal (DSA), a laser spike anneal (LSA), a flash anneal, a sub-second anneal (SSA) or an ultra sub-second anneal (uSSA). In some embodiments, the anneal 360 is performed at a temperature of about 700° C. to about 1300° C. In some embodiments, the anneal 360 drives an implanted dopant into at least one of the implanted ILD layer 240 or the implanted dummy poly layer 242. In some embodiments, the anneal 360 forms at least one of an ILD stress layer 260 or a second dummy poly layer 262 from the implanted ILD layer 240 or the implanted dummy poly layer 242, respectively. In some embodiments, the ILD stress layer 260 is over the ILD layer 230. In some embodiments, the second dummy poly layer 262 is over the first dummy poly layer 214. In some embodiments, at least one of the ILD stress layer 260 or the second dummy poly layer 262 includes at least one of Si, Ge, Ar, F, N, Xe, $BF_2$ or As.

In some embodiments, the anneal 360 forms at least one of a first stress memorization region 264 or a second stress memorization region 266, as illustrated in FIG. 12b. In some embodiments, the first stress memorization region 264 is formed by the ILD stress layer 260 expanding and compressing at least one of the first gate spacer 218, the second gate spacer 220, the CESL 226 or the dummy gate structure 208. In some embodiments, the expansion of the ILD stress layer 260 applies a compressive strain in the vertical direction of the dummy gate structure 208. In some embodiments, the compressive strain in the vertical direction enhances electron mobility in the nFET device 244. In some embodiments, the second stress memorization region 266 is formed by a compressive strain in the channel region 268. In some embodiments, the compressive strain in the channel region 268 results from a difference in grain size from the first dummy poly layer 214 to the second dummy poly layer 262. In some embodiments, the difference in grain size is caused by the anneal 360 recrystallizing the amorphous part of the implanted dummy poly layer 242. In some embodiments, the second dummy poly layer 262 has a second grain size that is larger than a first grain size of the first dummy poly layer 214. In some embodiments, the compressive strain in the channel region 268 enhances the hole mobility of the pFET device 246.

Figure 13:
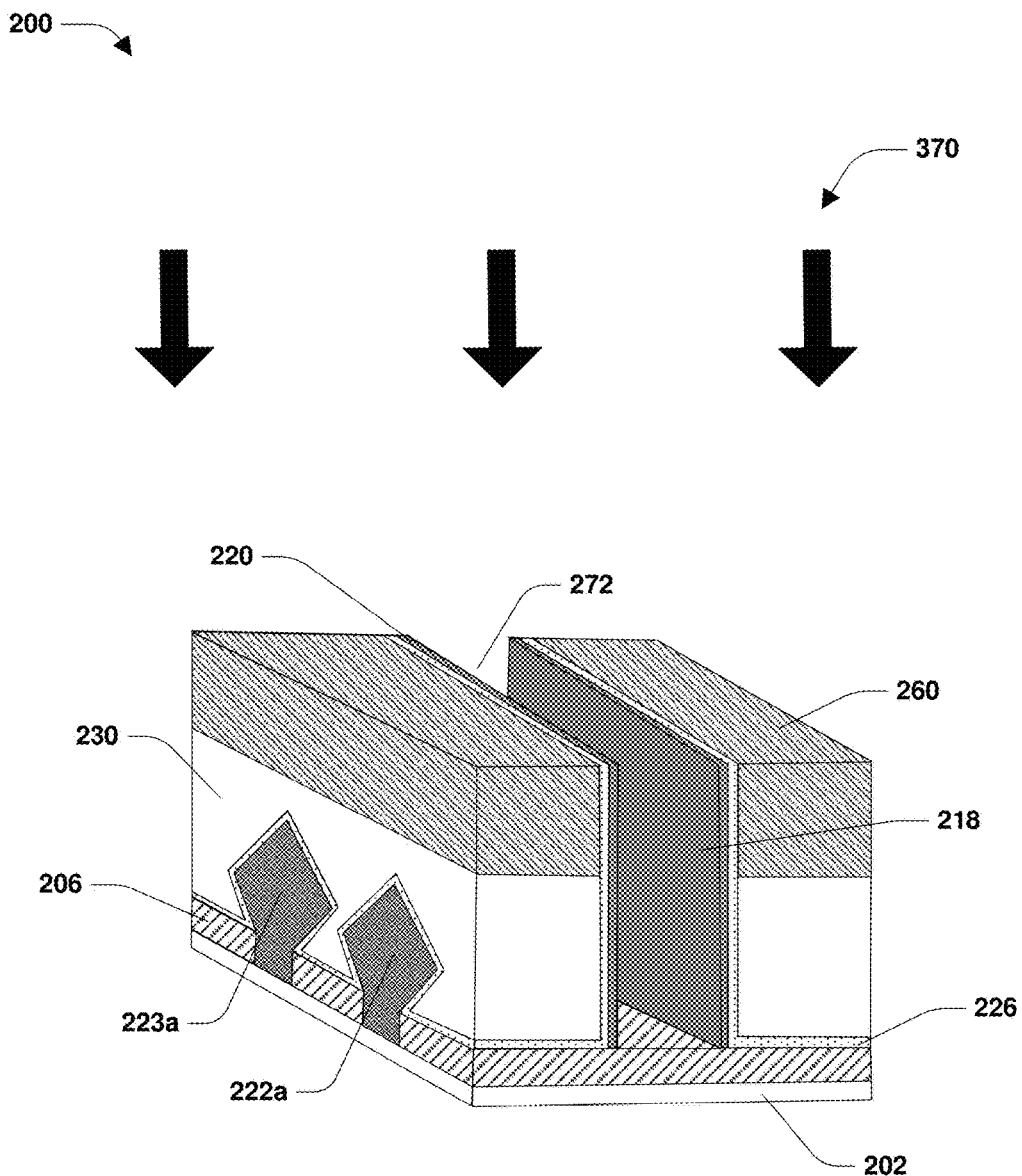
FIG. 13 is a perspective view of a semiconductor device during fabrication, according to some embodiments.

At 122, a replacement gate process is performed. In some embodiments, the dummy gate structure 208 is removed, as illustrated in FIG. 13. In some embodiments, the dummy gate structure 208 is removed by a process 370. In some embodiments, the process 370 includes at least one of a dry etching, a wet etching or a reactive ion etching process. In some embodiments, the removal of the dummy gate structure 208 forms an opening 272.

Figure 14:
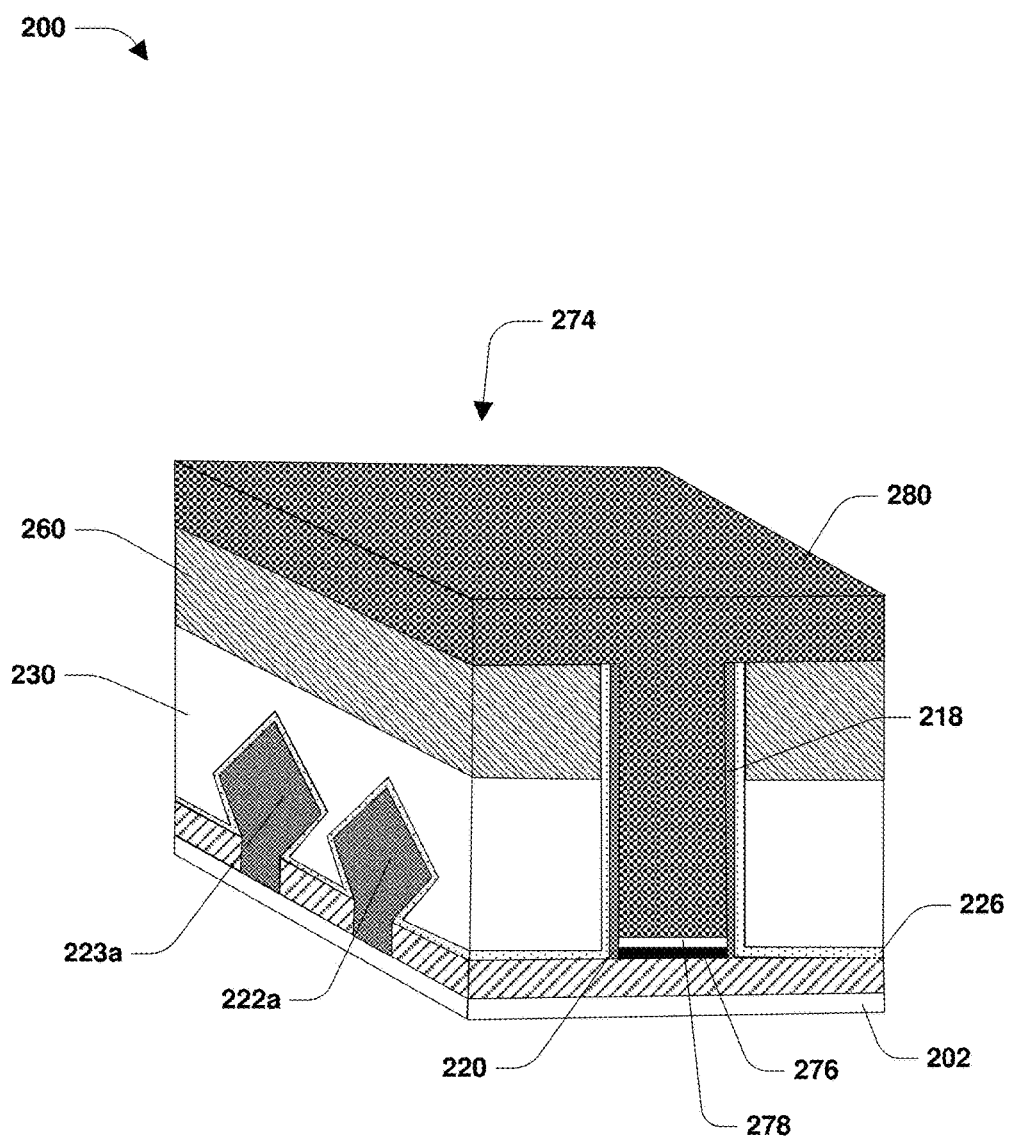
FIG. 14 is a perspective view of a semiconductor device during fabrication, according to some embodiments.

In some embodiments, a gate structure 274 is formed in the opening 272, as illustrated in FIG. 14. In some embodiments, the gate structure 274 includes at least one of an interfacial layer 276, a gate dielectric layer 278 or a gate electrode layer 280. In some embodiments, the gate structure 274 includes at least one of a first sidewall, a second sidewall and a top portion. In some embodiments, the top portion has a height 255. In some embodiments, the height 255 is about 5 to about 40 nm.

In some embodiments, the interfacial layer 276 is formed over the substrate 202. In some embodiments, the interfacial layer 276 includes at least one of silicon oxide or silicon oxynitride. In some embodiments, the interfacial layer 276 inhibits damage between the gate structure 274 and the substrate 202.

In some embodiments, the gate dielectric layer 278 is formed over the interfacial layer 276. In some embodiments, the gate dielectric layer 278 includes at least one of silicon oxide, silicon nitride, silicon oxynitride or high-k dielectric material. In some embodiments, the high-k dielectric material includes at least one of $HfO_2$, HfSiO, HfSiON, HfTaO, HfTiO, HfZrO, zirconium oxide, aluminum oxide or hafnium dioxide-alumina ($HfO_2$—$Al_2O_3$) alloy.

In some embodiments, the gate electrode layer 280 is formed over the gate dielectric layer 278, as illustrated in FIG. 14. In some embodiments, the gate electrode layer 280 includes a metal. In some embodiments, the gate electrode layer 280 includes at least one of polysilicon, aluminum, copper, titanium, tantalum, tungsten, molybdenum, tantalum nitride, nickel silicide, cobalt silicide, TiN, WN, TiAl, TiAlN, TaCN, TaC or TaSiN. In some embodiments, the gate electrode layer 280 includes a work function metal layer. In some embodiments, the gate electrode layer 280 fills the opening 272. In some embodiments, a process 380 is performed to planarize the top portion of at least one of the gate electrode layer 280 or the ILD stress layer 260, as illustrated in FIG. 15a and FIG. 15b. In some embodiments, the process 380 is a CMP process. In some embodiments, at least one of the first stress memorization region 264 or the second stress memorization region 266 is maintained through the formation of the gate structure 274.

In some embodiments, the gate structure 274 is formed by any suitable process or processes. In some embodiments, the gate structure 274 is formed by at least one of a deposition, photolithography patterning, or etching process. In some embodiments, the deposition process include at least one of a CVD, PVD, ALD, HDPCVD, MOCVD, RPCVD, PECVD or plating process. In some embodiments, the photolithography patterning process include at least one of a photoresist coating, soft baking, mask aligning, exposure, post-exposure baking, developing the photoresist, rinsing or drying process. In some embodiments, the photolithography exposing process includes at least one of maskless photolithography, electron-beam writing, and ion-beam writing. In some embodiments, the etching processes include at least one of dry etching, wet etching or reactive ion etching.

In some embodiments, the semiconductor device 200 includes other layers or features not specifically illustrated. In some embodiments, other back end of line (BEOL) processes are performed on the semiconductor device 200. In some embodiments, the method 100 is performed as a non-replacement metal gate process or a gate-first process.

According to some aspects of the instant disclosure, semiconductor device is provided. The semiconductor device comprising a channel region disposed between a source region and a drain region, a gate structure over the channel region, an interlayer dielectric (ILD) layer proximate the gate structure and an ILD stress layer proximate the top portion of gate structure and over the ILD layer. The gate structure comprising a first sidewall, a second sidewall and a top portion.

According to some aspects of the instant disclosure, a semiconductor device is provided. The semiconductor device comprising a channel region disposed between a source region and a drain region, a gate structure over the channel region, an interlayer dielectric (ILD) layer proximate the gate structure, an ILD stress layer proximate the top portion of gate structure and over the ILD layer and a first stress memorization region. The gate structure comprising a first sidewall, a second sidewall and a top portion. The first stress memorization region proximate the top portion of the gate structure.

According to some aspects of the instant disclosure, a method of forming a semiconductor device is provided. The method comprising forming a dummy gate structure over a substrate, forming a first gate spacer adjacent the first sidewall, forming a second gate spacer adjacent the second sidewall, forming an interlayer dielectric (ILD) layer over the substrate, performing an implantation on at least one of the ILD layer or the poly layer and performing an anneal, thereby forming at least one of an ILD stress layer over the ILD layer or a second dummy poly layer over the first dummy poly layer. The second dummy poly layer having a second grain size that is different than a first grain size of the first dummy poly layer. The dummy gate structure comprising a first sidewall, a second sidewall and a first dummy poly layer between the first sidewall and the second sidewall.

Although the subject matter has been described in language specific to structural features or methodological acts, it is to be understood that the subject matter of the appended claims is not necessarily limited to the specific features or acts described above. Rather, the specific features and acts described above are disclosed as example forms of implementing at least some of the claims.

Various operations of embodiments are provided herein. The order in which some or all of the operations are described should not be construed as to imply that these operations are necessarily order dependent. Alternative ordering will be appreciated given the benefit of this description. Further, it will be understood that not all operations are necessarily present in each embodiment provided herein. Also, it will be understood that not all operations are necessary in some embodiments.

Further, unless specified otherwise, "first," "second," or the like are not intended to imply a temporal aspect, a spatial aspect, an ordering, etc. Rather, such terms are merely used as identifiers, names, etc. for features, elements, items, etc. For example, a first channel and a second channel generally correspond to channel A and channel B or two different or two identical channels or the same channel.

It will be appreciated that layers, features, elements, etc. depicted herein are illustrated with particular dimensions relative to one another, such as structural dimensions or orientations, for purposes of simplicity and ease of understanding and that actual dimensions of the same differ substantially from that illustrated herein, in some embodiments. Additionally, a variety of techniques exist for forming the layers, regions, features, elements, etc. mentioned herein, such as implanting techniques, doping techniques, spin-on techniques, sputtering techniques, growth techniques, such as thermal growth or deposition techniques such as chemical vapor deposition (CVD), for example.

Moreover, "exemplary" is used herein to mean serving as an example, instance, illustration, etc., and not necessarily as advantageous. As used in this application, "or" is intended to mean an inclusive "or" rather than an exclusive "or". In addition, "a" and "an" as used in this application are generally be construed to mean "one or more" unless specified otherwise or clear from context to be directed to a singular form. Also, at least one of A and B or the like generally means A or B or both A and B. Furthermore, to the extent that "includes", "having", "has", "with", or variants thereof are used in either the detailed description or the claims, such terms are intended to be inclusive in a manner similar to the term "comprising".

Also, although the disclosure has been shown and described with respect to one or more implementations, equivalent alterations and modifications will occur to others skilled in the art based upon a reading and understanding of this specification and the annexed drawings. The disclosure includes all such modifications and alterations and is limited only by the scope of the following claims. In particular regard to the various functions performed by the above described components (e.g., elements, resources, etc.), the terms used to describe such components are intended to correspond, unless otherwise indicated, to any component which performs the specified function of the described component (e.g., that is functionally equivalent), even though not structurally equivalent to the disclosed structure. In addition, while a particular feature of the disclosure may have been disclosed with respect to only one of several implementations, such feature may be combined with one or more other features of the other implementations as may be desired and advantageous for any given or particular application.

What is claimed is:

1. A method of forming a semiconductor device, comprising:
    etching a substrate to define a fin structure;
    forming a dummy gate structure over a channel region of the fin structure;
    forming an interlayer dielectric (ILD) layer over a source region and a drain region that contact the channel region;
    implanting dopants into a portion of the ILD layer to define an implanted ILD layer over a second portion of the ILD layer in which the dopants are not implanted; and
    annealing the implanted ILD layer to stress the implanted ILD layer, wherein the stress applies a compressive force on the dummy gate structure.

2. The method of claim 1, wherein the etching comprises etching the substrate to define a second fin structure, and the method comprises:
    forming an isolation structure over a portion of the substrate left after etching the fin structure and the second fin structure and between the fin structure and the second fin structure.

3. The method of claim 1, comprising:
    etching a portion of the fin structure not covered by the dummy gate structure to define a first fin recess and a second fin recess.

4. The method of claim 3, comprising:
    growing a first epi-region in the first fin recess and a second epi-region in the second fin recess, the first epi-region corresponding to the source region and the second epi-region corresponding to the drain region.

5. The method of claim 1, comprising:
    depositing a contact etch stop layer (CESL) over the source region and the drain region prior to the forming an ILD layer.

6. The method of claim 1, comprising:
    depositing a contact etch stop layer (CESL) over the source region, the drain region, and the dummy gate structure prior to the forming an ILD layer.

7. The method of claim 6, wherein the forming an ILD layer comprises:
    forming the ILD layer over the CESL, the ILD layer overlying the source region, the drain region, and the dummy gate structure.

8. The method of claim 1, wherein the forming a dummy gate structure comprises:
    depositing a dummy polysilicon layer.

9. The method of claim 8, wherein the implanting comprises:
    implanting the dopants into a portion of the dummy polysilicon layer to define an implanted dummy polysilicon layer over a second portion of the dummy polysilicon layer in which the dopants are not implanted.

10. The method of claim 9, wherein annealing comprises:
    annealing the implanted dummy polysilicon layer.

11. The method of claim 10, wherein annealing the implanted dummy polysilicon layer causes an amorphous part of the implanted dummy polysilicon layer to be recrystallized.

12. The method of claim 11, wherein recrystallization of the implanted dummy polysilicon layer causes a compressive force to be applied to the channel region.

13. The method of claim 1, wherein the compressive force on the dummy gate structure causes a second compressive force to be applied to the channel region.

14. The method of claim 1, comprising:
    replacing the dummy gate structure with a gate structure after the annealing.

15. A method of forming a semiconductor device, comprising:
    etching a substrate to define a fin structure;
    forming a dummy gate structure over a channel region of the fin structure, the dummy gate structure comprising a dummy polysilicon layer;
    implanting dopants into a portion of the dummy polysilicon layer to define an implanted dummy polysilicon layer over a second portion of the dummy polysilicon layer in which the dopants are not implanted; and
    annealing the implanted dummy polysilicon layer to recrystallize the implanted dummy polysilicon layer, wherein recrystallization of the implanted dummy polysilicon layer causes a compressive force to be applied to the channel region.

16. The method of claim 15, comprising:
    etching a portion of the fin structure not covered by the dummy gate structure to define a first fin recess and a second fin recess; and
    growing a first epi-region in the first fin recess and a second epi-region in the second fin recess, the first epi-region corresponding to a source region and the second epi-region corresponding to a drain region.

17. The method of claim 16, comprising:
    forming an interlayer dielectric (ILD) layer over the source region and the drain region; and
    implanting the dopants into a portion of the ILD layer to define an implanted ILD layer over a second portion of the ILD layer in which the dopants are not implanted.

18. The method of claim 17, wherein the annealing comprises:
    annealing the implanted ILD layer to stress the implanted ILD layer, wherein the stress applies a compressive force on the dummy gate structure.

19. The method of claim 18, wherein the compressive force on the dummy gate structure causes a second compressive force to be applied to the channel region.

20. A method of forming a semiconductor device, comprising:
    etching a substrate to define a fin structure;
    forming a dummy gate structure over a channel region of the fin structure, the dummy gate structure comprising a dummy polysilicon layer;
    growing a first epi-region adjacent a first side of the channel region and a second epi-region adjacent a second side of the channel region, the first epi-region corresponding to a source region and the second epi-region corresponding to a drain region;
    forming an interlayer dielectric (ILD) layer over the source region and the drain region;
    implanting dopants into a portion of the ILD layer to define an implanted ILD layer over a second portion of the ILD layer in which the dopants are not implanted and into a portion of the dummy polysilicon layer to define an implanted dummy polysilicon layer over a second portion of the dummy polysilicon layer in which the dopants are not implanted; and
    annealing the implanted ILD layer and the implanted dummy polysilicon layer to stress the implanted ILD layer and to recrystallize the implanted dummy polysilicon layer.

* * * * *

UNITED STATES PATENT AND TRADEMARK OFFICE
CERTIFICATE OF CORRECTION

PATENT NO. : 9,653,581 B2
APPLICATION NO. : 15/006263
DATED : January 26, 2016
INVENTOR(S) : Lu et al.

Page 1 of 1

It is certified that error appears in the above-identified patent and that said Letters Patent is hereby corrected as shown below:

On the Title Page

Item (57) Abstract: At Line 9 of the narrative please insert the word --to-- after the word "proximate" and before the word "the".

Signed and Sealed this
Thirty-first Day of October, 2017

Joseph Matal
*Performing the Functions and Duties of the*
*Under Secretary of Commerce for Intellectual Property and*
*Director of the United States Patent and Trademark Office*